US008462187B2

(12) United States Patent
Nishi

(10) Patent No.: US 8,462,187 B2
(45) Date of Patent: Jun. 11, 2013

(54) THERMAL PRINT HEAD

(75) Inventor: Koji Nishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 36 days.

(21) Appl. No.: 13/307,875

(22) Filed: Nov. 30, 2011

(65) Prior Publication Data
US 2012/0133724 A1    May 31, 2012

(30) Foreign Application Priority Data

Nov. 30, 2010    (JP) ................................. 2010-267098
Nov. 30, 2010    (JP) ................................. 2010-267099

(51) Int. Cl.
    *B41J 2/35*    (2006.01)
(52) U.S. Cl.
    USPC ....................................... 347/204
(58) Field of Classification Search
    USPC ................................ 347/200–211
    See application file for complete search history.

(56) References Cited

U.S. PATENT DOCUMENTS

| 5,278,580 A * | 1/1994 | Nishikawa et al. ........... 347/200 |
| 6,151,054 A * | 11/2000 | Shimizu ........................ 347/204 |
| 6,335,750 B2 * | 1/2002 | Horiuchi et al. .............. 347/200 |
| 2010/0053294 A1 * | 3/2010 | Fukumoto .................... 347/200 |

FOREIGN PATENT DOCUMENTS

JP        2976087        9/1999

* cited by examiner

*Primary Examiner* — Kristal Feggins
(74) *Attorney, Agent, or Firm* — Hamre, Schumann, Mueller & Larson, P.C.

(57) ABSTRACT

A thermal print head includes a substrate, a resistor layer supported on the substrate and provided with a plurality of heating portions arranged along a primary scanning direction, an electrode layer provided with a plurality of individual electrodes arranged along the primary scanning direction, a drive IC configured to selectively apply an electric current to the plurality of heating portions, and a plurality of wires connected to the plurality of individual electrodes and the drive IC, the plurality of individual electrodes including strip-shaped portions electrically connected to the heating portions and arranged along the primary scanning direction and pad portions greater in width in the primary scanning direction than the strip-shaped portions, the pad portions including bonding pads connected to each of the plurality of wires and probe contact pads, the probe contact pads being narrower in width in the primary scanning direction than bonding pads.

20 Claims, 14 Drawing Sheets

THERMAL PRINT HEAD

CROSS-REFERENCE TO RELATED APPLICATIONS

This application is based upon and claims the benefit of priority from Japanese Patent Application Nos. 2010-267098, filed on Nov. 30, 2010, and 2010-267099, filed on Nov. 30, 2010, the entire contents of which are incorporated herein by reference.

TECHNICAL FIELD

The present disclosure relates to a thermal print head.

BACKGROUND

FIG. 13 partially illustrates a plan-view structure of a conventional thermal print head (see, e.g., JP2976087B). A thermal print head X shown in FIG. 13 includes a substrate 91, heating portions 92 made of resistor layer provided on the substrate 91, an electrode layer 93 for applying an electric current to the heating portions 92 and a drive IC 94. The heating portions 92 are finely divided in a primary scanning direction x and are independently heated by the drive IC 94. The electrode layer 93 includes a common electrode 95 and a plurality of individual electrodes 96 arranged along the primary scanning direction x. As shown in FIG. 13, electrode wiring lines 95a of comb teeth shape extend from the common electrode 95 at a regular interval. One end section of each of the individual electrodes 96 is positioned between the mutually adjoining electrode wiring lines 95a. Pad portions 97 are provided in the other end sections of the respective individual electrodes 96. The pad portions 97 are connected to pads 94a of the drive IC 94 through wires. The drive IC 94 can heat the heating portions 92 positioned in desired positions by selectively applying the electric current to the individual electrodes 96.

In order to arrange the heating portions 92 of, e.g., 200 dpi, namely 8 dots in a length of 1 mm, the respective individual electrodes 96 have a fine pitch of 0.125 mm. As a result, the electrode wiring lines 95a and the individual electrodes 96 are formed into fine wiring patterns. A pad surface having a specified width is needed to properly perform wire bonding. In the example illustrated in FIG. 13, the width of the respective pad portions 97 is secured by arranging the pad portions 97 in a staggered pattern. If the pad portions 97 are arranged in line, the sections of the wires making contact with the pad portions 97 tend to becomes dense, which may possibly make it difficult to bond the wires.

In a process of manufacturing the thermal print head X, an open-short test is conducted between the individual electrodes 96 or pulse trimming is performed to make the resistance value of the heating portions 92 equal to an expected value. When performing these tasks, for example, a test probe 98 is bought into contact with each of the pad portions 97 as shown in FIG. 14.

As can be seen in FIG. 14, a probe mark 97a is generated on the pad surface if the test probe 98 is bought into contact with each of the pad portions 97. The portion having such a scratch is not suitable for use in wire bonding. For this reason, it is necessary that each of the pad portions 97 be divided beforehand into a probe contact pad 97b and a bonding pad 97c for wire bonding. JP2976087B illustrates an example in which the probe contact pad 97b is formed in a position spaced apart from the bonding pad 97c. In any case, the dimension of each of the pad portions 97 in a secondary scanning direction y tends to become greater.

In this aspect, the plurality of pad portions 97 may be arranged at an increased density in the primary scanning direction x. As the density of the plurality of the pad portions 97 increases, the dimension in the secondary scanning direction y of a pad installation region 97A needed to install the pad portions 97 tends to increase. This has an adverse affect in reducing the size of the thermal print head X.

SUMMARY

To address the above problems, the present disclosure provides a thermal print head capable of reducing a pad installation region.

A thermal print head according to one aspect of the present disclosure includes: a substrate; a resistor layer supported on the substrate and provided with a plurality of heating portions arranged along a primary scanning direction; an electrode layer provided with a plurality of individual electrodes arranged along the primary scanning direction; a drive IC configured to selectively apply an electric current to the plurality of heating portions; and a plurality of wires connected to the plurality of the individual electrodes and the drive IC, the plurality of individual electrodes including strip-shaped portions electrically connected to the heating portions and arranged along the primary scanning direction and pad portions greater in width in the primary scanning direction than the strip-shaped portions, the pad portions including bonding pads connected to the plurality of wires and probe contact pads, the probe contact pads being narrower in width in the primary scanning direction than bonding pads, the plurality of individual electrodes including first individual electrodes provided with first pad portions and second individual electrodes adjoining the first individual electrodes and provided with second pad portions, the first pad portions and the second pad portions at least partially overlapping with each other when seen in the primary scanning direction.

In another embodiment of the present disclosure, the first pad portions may include first bonding pads, the second pad portions including second bonding pads, the first bonding pads and the second bonding pads not overlapping with each other when viewed from the primary scanning direction.

In an alternate embodiment of the present disclosure, the first individual electrodes may include first strip-shaped portions connected to the first pad portions, the first pad portions including the first bonding pads and first probe contact pads spaced apart from the first strip-shaped portions farther than the first bonding pads in a secondary scanning direction, the second individual electrodes including second strip-shaped portions connected to the second pad portions, the second pad portions including the second bonding pads and second probe contact pads spaced apart from the second strip-shaped portions farther than the second bonding pads in the secondary scanning direction, the second bonding pads and the first probe contact pads at least partially overlapping with each other when viewed from the primary scanning direction.

In yet another embodiment of the present disclosure, the first individual electrodes may include first strip-shaped portions connected to the first pad portions, the first pad portions including the first bonding pads and first probe contact pads positioned closer to the first strip-shaped portions than the first bonding pads in a secondary scanning direction, the second individual electrodes including second strip-shaped portions connected to the second pad portions, the second pad portions including the second bonding pads and second probe contact pads positioned closer to the second strip-shaped portions than the second bonding pads in the secondary scanning direction, the first bonding pads and the second probe contact pads at least partially overlapping with each other when viewed from the primary scanning direction.

In still another embodiment of the present disclosure, the first individual electrodes may include first strip-shaped portions connected to the first pad portions, the first pad portions including the first bonding pads and first probe contact pads spaced apart from the first strip-shaped portions farther than the first bonding pads in a secondary scanning direction, the second individual electrodes including second strip-shaped portions connected to the second pad portions, the second pad portions including the second bonding pads and second probe contact pads positioned closer to the second strip-shaped portions than the second bonding pads in the secondary scanning direction.

In still another embodiment of the present disclosure, the first bonding pads and the second probe contact pads may at least partially overlap with each other when seen in the primary scanning direction.

In still another embodiment of the present disclosure, the first bonding pads may be smaller in length in the secondary scanning direction y than the second probe contact pads.

In still another embodiment of the present disclosure, the first bonding pads and the second strip-shaped portions may at least partially overlap with each other when seen in the primary scanning direction, the first probe contact pads and the second probe contact pads at least partially overlapping with each other when seen in the primary scanning direction.

In still another embodiment of the present disclosure, the pad portions may include connecting portions provided between the bonding pads and the probe contact pads in a secondary scanning direction, the connecting portions formed such that the width thereof in the primary scanning direction is gradually increased as the connecting portions come closer to the bonding pads in the secondary scanning direction.

In still another embodiment of the present disclosure, pad-connecting portions may be provided between the strip-shaped portions and the pad portions, the pad-connecting portions formed such that the width thereof in the primary scanning direction is gradually increased as the connecting portions come closer to the pad portions in a secondary scanning direction.

In still another embodiment of the present disclosure, probe marks are formed in the probe contact pads.

In still another embodiment of the present disclosure, the electrode layer may include a normal thickness portion and an increased thickness portion thicker than the normal thickness portion, the increased thickness portion including the bonding pads.

In still another embodiment of the present disclosure, the electrode layer may include a main Au layer making up the normal thickness portion and an auxiliary Au layer formed on the main Au layer, the main Au layer and the auxiliary Au layer making up the increased thickness portion.

In still another embodiment of the present disclosure, the auxiliary Au layer may be made of a material containing Au mixed with glass.

In still another embodiment of the present disclosure, the auxiliary Au layer may be higher in Au percentage than the main Au layer.

In still another embodiment of the present disclosure, the main Au layer and the auxiliary Au layer may be formed by printing Au-containing paste and then sintering the paste.

In still another embodiment of the present disclosure, the auxiliary Au layer may be formed to expose the probe contact pads.

In still another embodiment of the present disclosure, the resistor layer may contain $TaSiO_2$ or TaN.

In still another embodiment of the present disclosure, the resistor layer may be formed by printing paste containing $TaSiO_2$ or TaN and then sintering the paste.

In still another embodiment of the present disclosure, the thermal print head may further include: a glaze layer including a heating resistor support portion extending in the primary scanning direction and having an arc-like cross-sectional shape on a plane perpendicular to the primary scanning direction and an IC electrode support portion spaced apart from the heating resistor support portion in a secondary scanning direction, the IC electrode support portion positioned between the pad portions and the substrate.

Other features and advantages of the present disclosure will become more apparent from the detailed description made in conjunction with the accompanying drawings.

DETAILED DESCRIPTION

Figure 1:
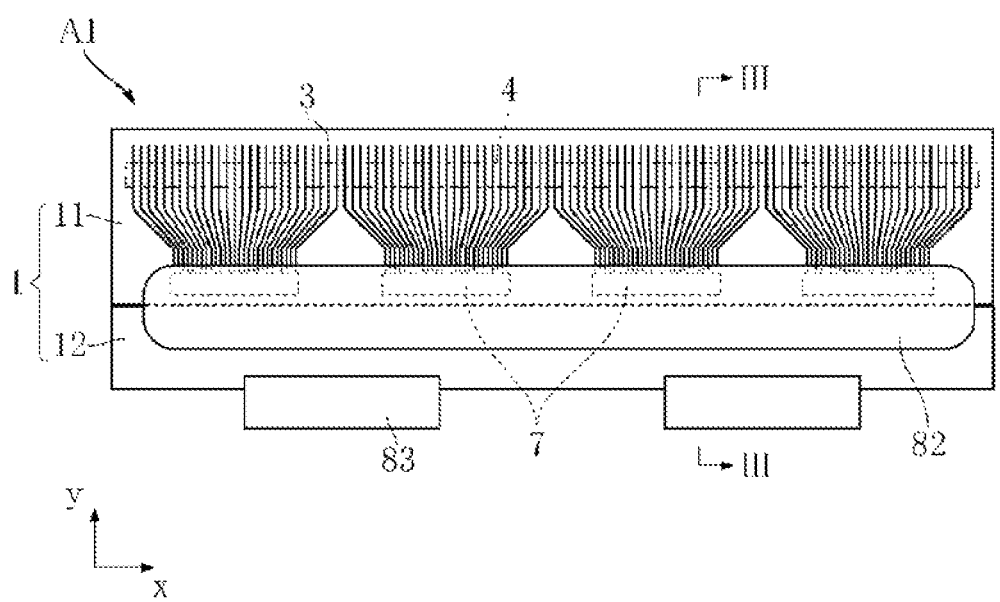
FIG. 1 is a plan view showing a thermal print head according to a first embodiment of the present disclosure.

Certain preferred embodiments will now be described in detail with reference to the drawings.

FIGS. 1 through 5 show a thermal print head according to a first embodiment of the present disclosure. The thermal print head A1 of the present embodiment includes a support unit 1, a glaze layer 2, an electrode layer 3, a resistor layer 4, a protective layer 5, a resin layer 6, a drive IC 7 and an encapsulation resin 82. The thermal print head A1 is incorporated into a printer to print on thermal paper for different uses, e.g., a barcode sheet or a receipt. For the sake of understanding, the protective layer 5 and the resin layer 6 are omitted in FIG. 1.

Figure 3:
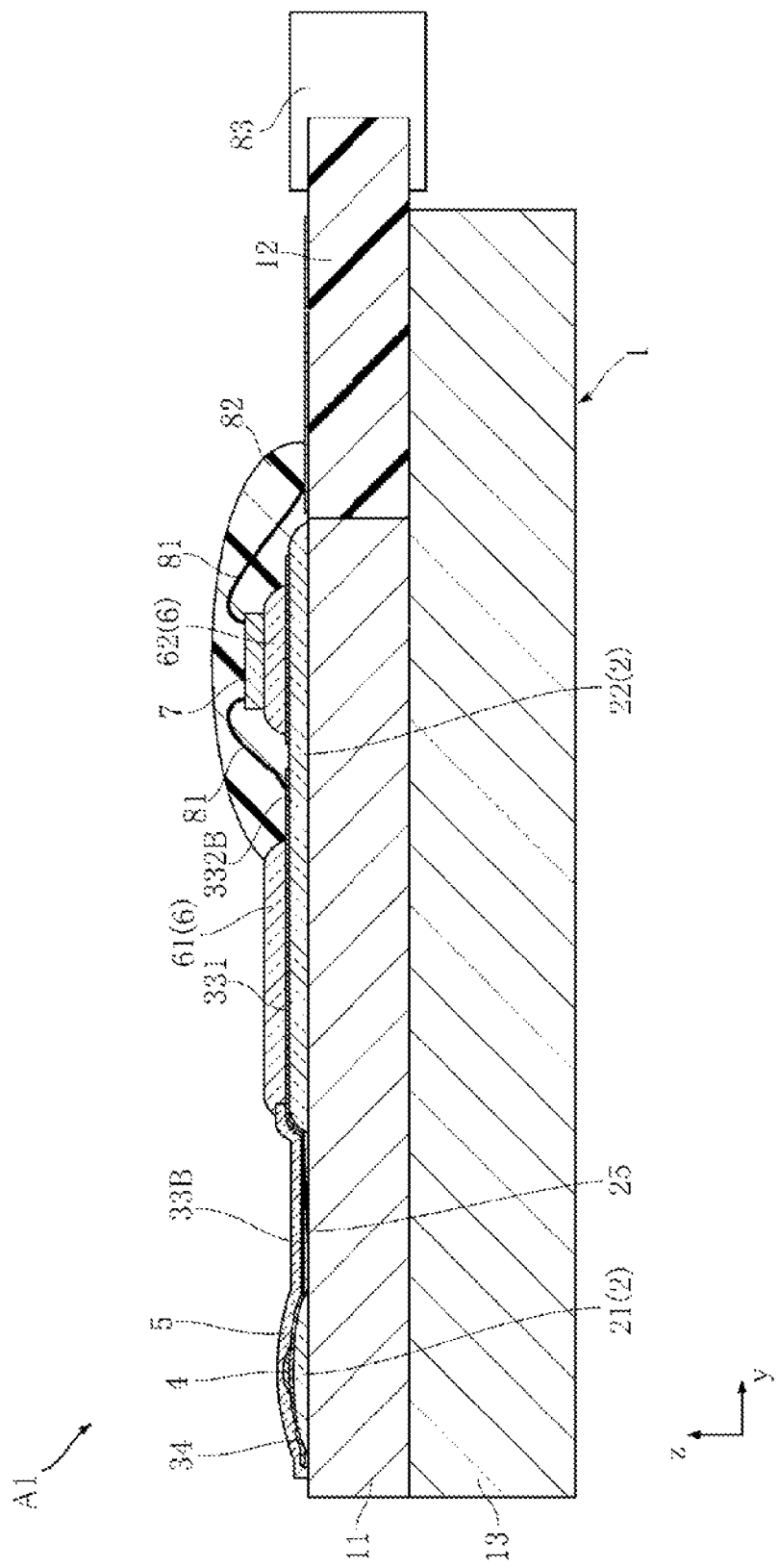
FIG. 3 is a section view of the thermal print head taken along line in FIG. 1.

The support unit 1 forms a base of the thermal print head A1 and includes a ceramic substrate 11, a wiring substrate 12 and a heat radiating plate 13. The ceramic substrate 11 is made of e.g., ceramic such as $Al_2O_3$, and has a thickness of, e.g., about 0.6 to 1.0 mm. As shown in FIG. 1, the ceramic substrate 11 is formed into an elongated rectangular shape extending in a primary scanning direction x. The wiring substrate 12 has a structure in which a base layer made of, e.g., a glass epoxy resin, and a wiring layer made of, e.g., Cu, are laminated one above another. As shown in FIG. 3, a connector 83 for connecting the thermal print head A1 to the printer is attached to the wiring substrate 12. The heat radiating plate 13 serves to radiate heat from the ceramic substrate 11 and is made of metal, e.g., A1.

Figure 4:
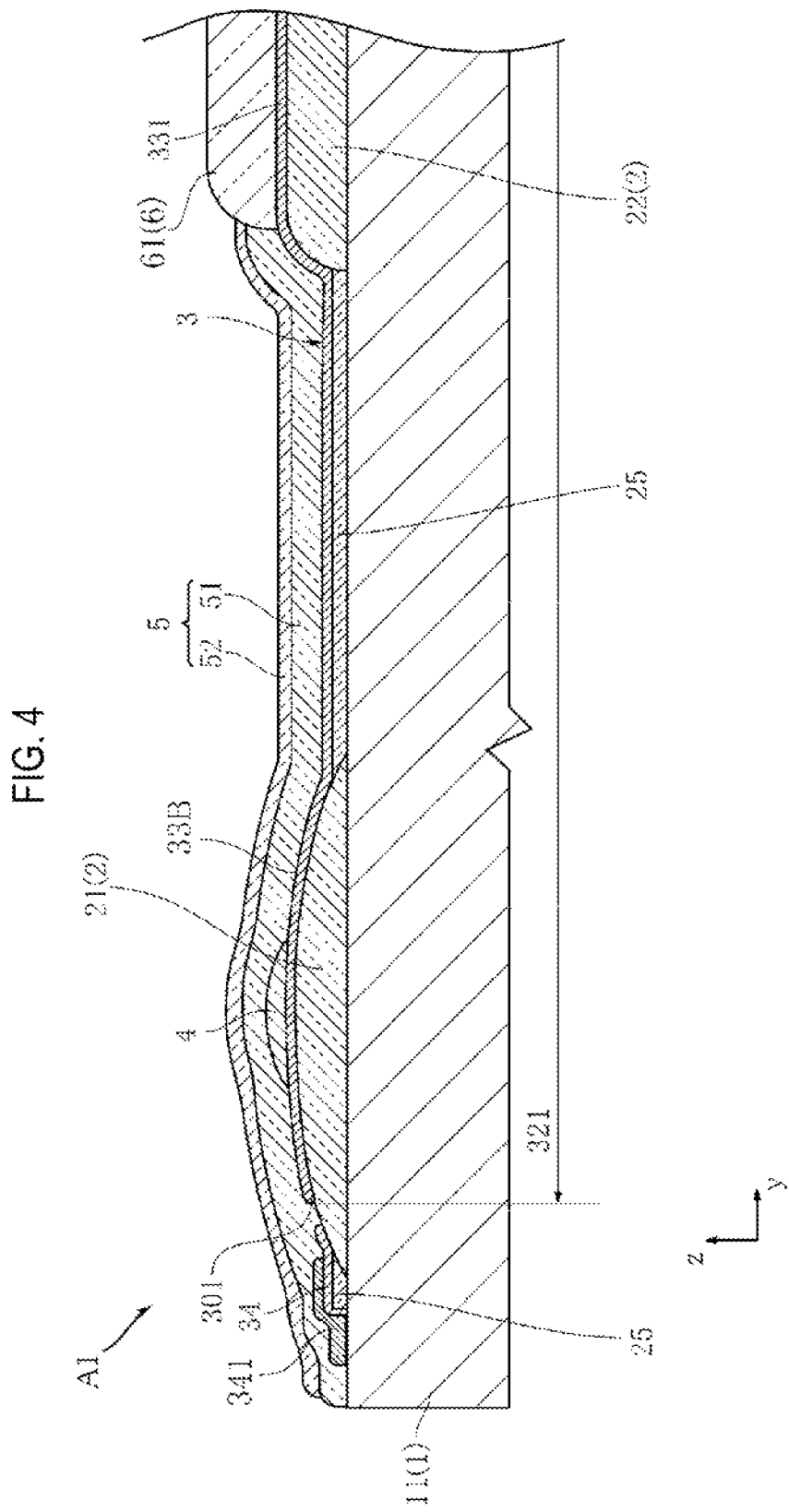
FIG. 4 is a partially enlarged section view of the thermal print head shown in FIG. 3.

The glaze layer 2 is formed on the ceramic substrate 11 and is made of a glass material, e.g., amorphous glass. The glass material has a softening point of, e.g., 800 to 850° C. The glaze layer 2 includes a heating resistor support portion 21 and an IC electrode support portion 22. The heating resistor support portion 21 extends along the primary scanning direction x and has an arc-like cross-sectional shape on a y-z plane containing a secondary scanning direction y and a thickness direction z as shown in FIGS. 3 and 4. The heating resistor support portion 21 is sized such that the dimension thereof in the secondary scanning direction y is, e.g., about 700 μm, and the dimension thereof in the thickness direction z is about 18 to 50 μm. The heating resistor support portion 21 is provided to press the heating area of the resistor layer 4 against a thermal paper as a print target. The IC electrode support portion 22 is provided in a position spaced apart from the heating resistor support portion 21 in the secondary scanning direction y. The IC electrode support portion 22 supports a portion of the electrode layer 3 and the drive IC 7. The IC electrode support portion 22 has a thickness of about 50 μm.

The area of the ceramic substrate 11 interposed between the heating resistor support portion 21 and the IC electrode support portion 22 is covered with a glass layer 25. The glass layer 25 has a softening point of, e.g., 680° C., and is made of glass whose softening point is lower than the softening point of the glass making up the glaze layer 2. The glass layer 25 has a thickness of about 2.0 μm.

The electrode layer 3 is provided to define a route for applying an electric current to the resistor layer 4. In the present embodiment, the electrode layer 3 includes a main Au layer 301 and an auxiliary Au layer 302. The main Au layer 301 is made of resinate Au having an Au percentage of about 97% and is added with additives such as rhodium, vanadium, bismuth and silicon. In the present embodiment, the main Au layer 301 has a thickness of about 0.6 μm. The auxiliary Au layer 302 is formed on the main Au layer 301 and is made of resinate Au having an Au percentage of about 99.7%. The auxiliary Au layer 302 has a thickness of about 0.3 μm. Instead of the material set forth above, the auxiliary Au layer 302 may be made of a material having an Au percentage of about 60% and mixed with glass frits. In this case, the auxiliary Au layer 302 has a thickness of about 1.1 μm.

The electrode layer 3 includes a plurality of individual electrodes 33 and a common electrode 34. Just like the conventional thermal print head X shown in FIG. 13, the common electrode 34 includes electrode wiring lines of comb teeth shape (not shown). End sections of the individual electrodes 33 are positioned between the electrode wiring lines. Common electrode 34 is formed to bypass the installation regions of the individual electrodes 33 and extend into the underside of the drive IC 7.

The common electrode 34 is formed of the main Au layer 301. As shown in FIG. 4, an auxiliary common electrode 341 is provided in an overlapping relationship with the common electrode 34 to increase electric conductivity. The auxiliary common electrode 341 can be made of Ag. The bypass section of the common electrode 34 set forth above may be formed of only the auxiliary common electrode 341.

Figure 2:
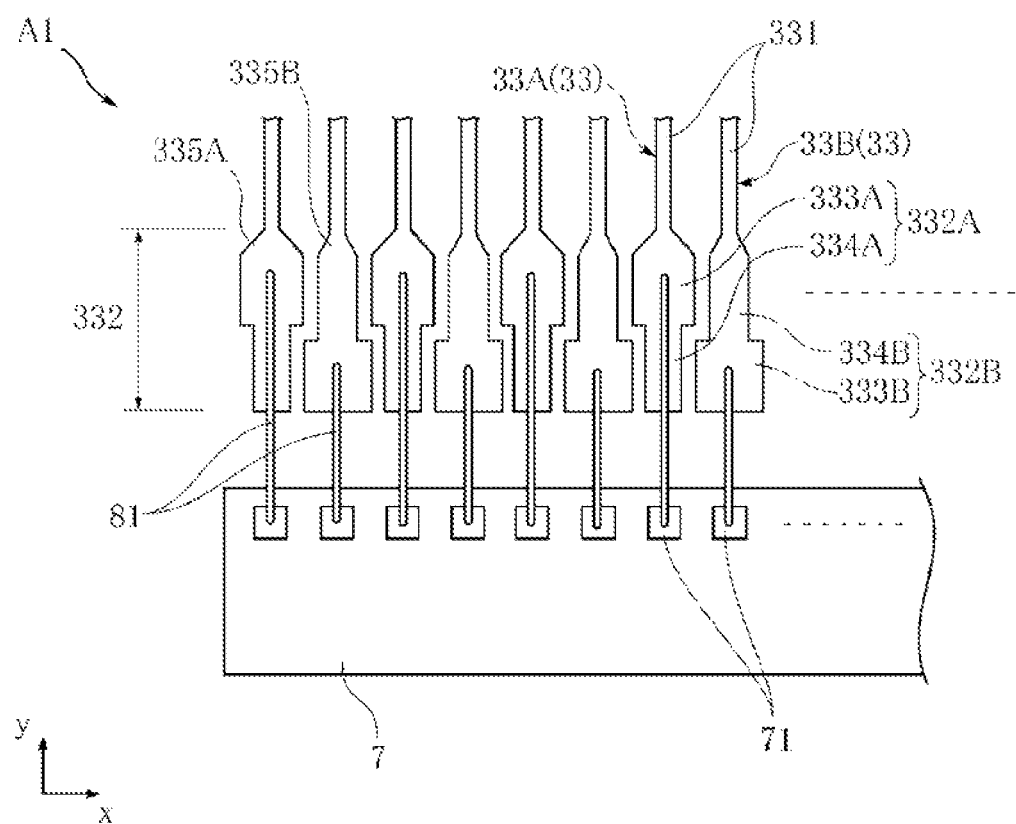
FIG. 2 is an enlarged view of major portions of the thermal print head shown in FIG. 1.

The plurality of the individual electrodes 33 is provided to partially apply the electric current to the resistor layer 4. Referring to FIG. 2, the plurality of the individual electrodes 33 includes two kinds of individual electrodes 33A and 33B. The individual electrodes 33A and 33B are alternately arranged in the primary scanning direction x. The individual electrodes 33A and 33B include strip-shaped portions 331 having one end section interposed between the electrode wiring lines of the common electrode 34 and pad portions 332A and 332B connected to the other end section of the strip-shaped portions 331. The pad portions 332A and 332B include bonding pads 333A and 333B and probe contact pads 334A and 334B. In the example shown in FIG. 2, pad-connecting portions 335A and 335B are provided between the strip-shaped portions 331 and the pad portions 332A and 332B. The pad-connecting portions 335A and 335B are formed such that the width thereof in the primary scanning direction x is gradually increased as the pad-connecting portions 335A and 335B get closer to the pad portions 332A and 332B in the secondary scanning direction y.

In the pad portions 332A, one end section of the bonding pads 333A are connected to the pad-connecting portions 335A. The probe contact pads 334A extend from the other end section of the bonding pads 333A. In other words, the probe contact pads 334A are positioned farther than the bonding pads 333A from the strip-shaped portions 331 in the secondary scanning direction y. As shown in FIG. 2, the bonding pads 333A are formed with a greater width than the probe contact pads 334A in the primary scanning direction x. The probe contact pads 334A are formed with a greater width than the strip-shaped portions 331 in the primary scanning direction x.

In the pad portions 332B, one end section of the probe contact pads 334B is connected to the pad-connecting portions 335B. The bonding pads 333B extend from the other end sections of the probe contact pads 334B. In other words, the probe contact pads 334B are positioned closer to the strip-shaped portions 331 than the bonding pads 333B in the secondary scanning direction y. As shown in FIG. 2, the bonding pads 333B are formed with a greater width than the probe contact pads 334B in the primary scanning direction x. The probe contact pads 334B are formed with a greater width than the strip-shaped portions 331 in the primary scanning direction x.

Referring again to FIG. 2, the length of the bonding pads 333A in the secondary scanning direction y is shorter than the length of the probe contact pads 334B in the secondary scanning direction y. The length of the bonding pads 333B in the secondary scanning direction y is shorter than the length of the probe contact pads 334A in the secondary scanning direction y. The bonding pads 333A are arranged to adjoin the probe contact pads 334B. The bonding pads 333B are arranged to adjoin the probe contact pads 334A. In other words, the bonding pads 333A and the probe contact pads 334B overlap with each other when seen in the primary scanning direction x. The bonding pads 333B and the probe contact pads 334A overlap with each other when seen in the primary scanning direction x. It is therefore possible to make uniform the positions of the other end sections of the pad portions 332A and pad portions 332B in the secondary scanning direction y. Accordingly, the length of a pad installation region 332 in the secondary scanning direction y is equal to the length of each of the pad portions 332A and 332B.

As an example, the plurality of the strip-shaped portions 331 are arranged at an interval of 75 µm in the primary scanning direction x, each of the strip-shaped portions 331 having a width of 30 µM, each of the probe contact pads 334A and 334B having a width of 50 µm and each of the bonding pads 333A and 333B having a width of 70 µm. At this time, the gap between the bonding pads 333A and the probe contact pads 334B adjoining each other is equal to 15 µm. Likewise, the gap between the bonding pads 333B and the probe contact pads 334A adjoining each other is equal to 15 µm. The length of the pad installation region 332 in the secondary scanning direction y is equal to 230 µm.

Figure 5:
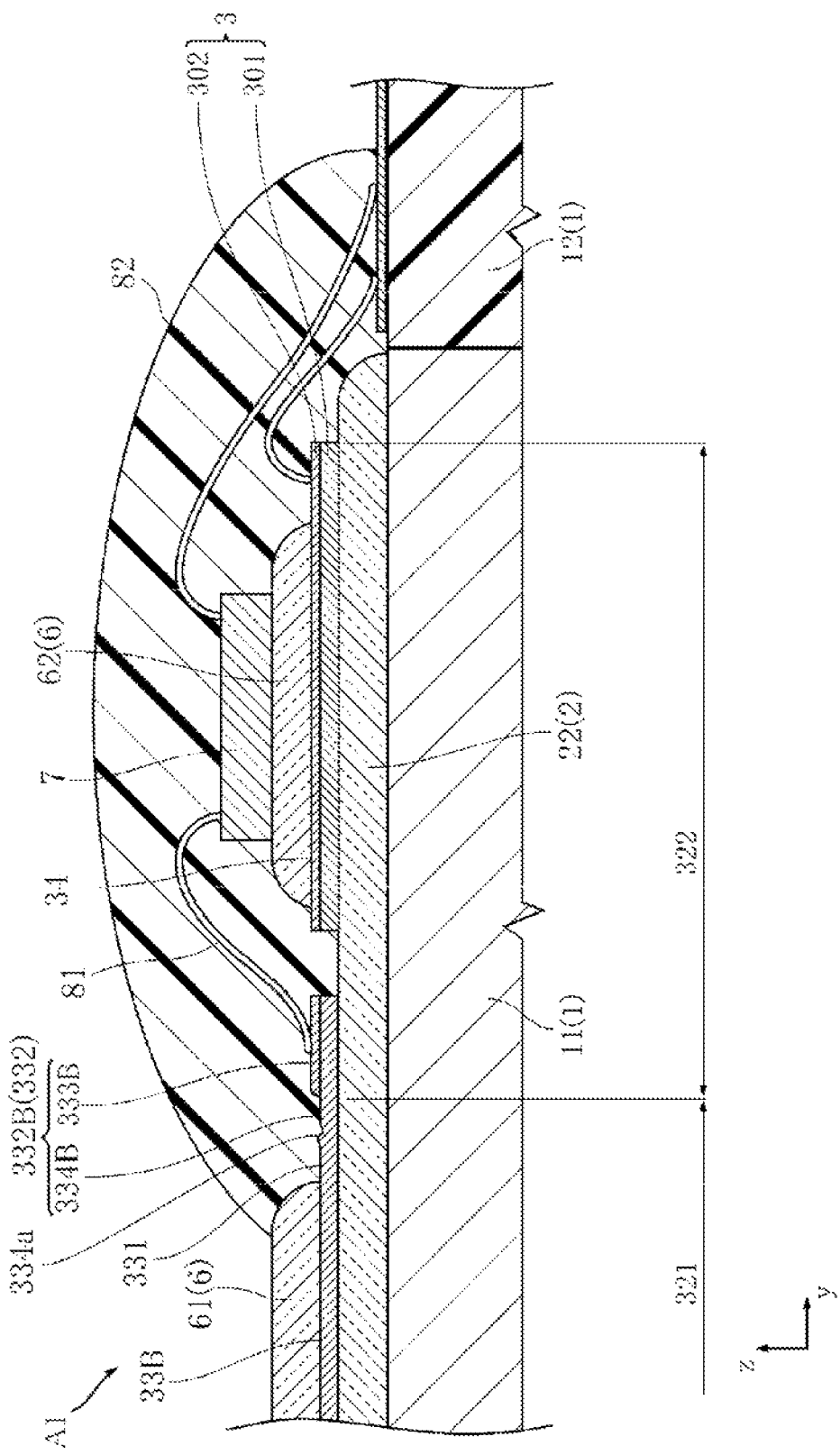
FIG. 5 is another partially enlarged section view of the thermal print head shown in FIG. 3.
Figure 14:
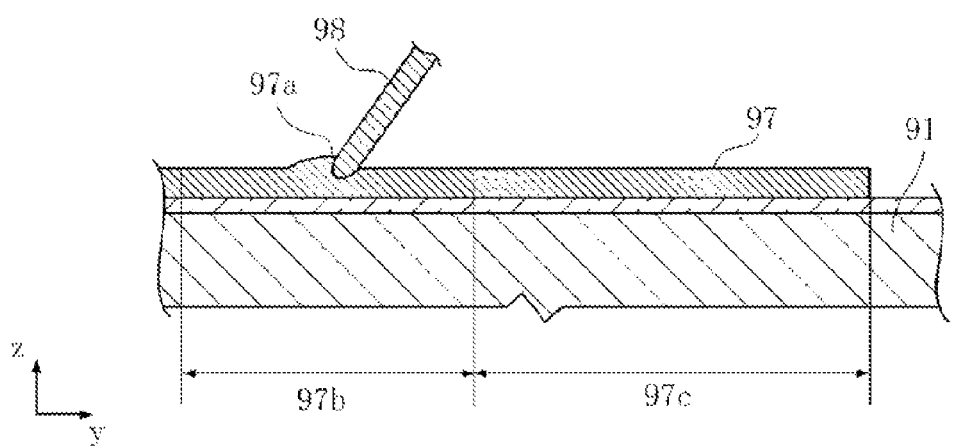
FIG. 14 is a view for explaining the conventional thermal print head.

One of the individual electrodes 33B is shown in the section views of FIGS. 3 through 5. As shown in FIG. 3, one end section of each of the strip-shaped portions 331 is positioned on the heating resistor support portion 21. The section of each of the strip-shaped portions 331 extending from the heating resistor support portion 21 in the secondary scanning direction y is formed on the glass layer 25. As shown in FIG. 5, each of the pad portions 332B is formed on the IC electrode support portion 22. Referring to FIG. 5, a probe mark 334a is formed in each of the probe contact pads 334B. The probe mark 334a is generated by bringing a test probe into contact with each of the probe contact pads 334A and 33B in the manufacturing process of the thermal print head A1 as shown in FIG. 14 which illustrates a conventional thermal print head. The difference between the individual electrodes 33A and the individual electrodes 33B resides in only the positional relationship of the bonding pads 333A and 333B and the probe contact pads 334A and 334B of the pad portions 332A and 332B. Therefore, the individual electrodes 33A have the same cross-sectional structure as that of the individual electrodes 33B. The same probe mark as the probe mark 334a is also generated in each of the individual electrodes 33A.

As shown in FIGS. 4 and 5, the electrode layer 3 is divided into a normal thickness portion 321 and an increased thickness portion 322. The normal thickness portion 321 is formed of the main Au layer 301 to occupy the most part of the electrode layer 3. The increased thickness portion 322 is the portion where the main Au layer 301 and the auxiliary Au layer 302 overlap with each other. The bonding pads 333A and 333B correspond to the increased thickness portion 322. In the present embodiment, the normal thickness portion 321 has a thickness of about 0.6 µm and the increased thickness portion 322 has a thickness of about 0.9 µm. If the auxiliary Au layer 302 is made of a material mixed with glass frits as set forth above, the increased thickness portion 322 has a thickness of about 1.7 µm.

In the present embodiment, the probe contact pads 334A and 334B are formed of the normal thickness portion 321. In other words, the auxiliary Au layer 302 is formed to expose the probe contact pads 334A and 334B.

The electrode layer 3 is formed by a method in which a conductor film is formed by printing and sintering resinate Au and then unnecessary portions are removed by photo-etching.

The resistor layer 4 is heated by partially applying the electric current to the same through the electrode layer 3. Print dots are formed by heating the resistor layer 4. The resistor layer 4 is made of $TaSiO_2$ or TaN, and is about 9 to 10 µm in thickness. The resistor layer 4 includes a plurality of heating portions. Each of the heating portions is arranged on the heating resistor support portion 21 to cover the gap between the electrode wiring lines of the common electrode 34 and one end section of the strip-shaped portions 331 and they are heated by applying the electric current.

The resistor layer 4 is formed by printing and sintering a paste material containing $TaSiO_2$ or TaN, on the region overlapping the heating resistor support portion 21 of the electrode layer 3.

The protective layer 5 is provided to protect the electrode layer 3 and the resistor layer 4. In the present embodiment, the protective layer 5 includes a lower layer 51 and an upper layer 52 formed one above another. The lower layer 51 is made of $SiO_2$ and is about 2 µm in thickness. The upper layer 52 is made of a material containing SiC and is about 6 µm in thickness.

The resin layer 6 is made of an insulating resin and includes an electrode portion 61 and an IC portion 62. The electrode portion 61 covers most parts of the individual electrodes 33A and 33B with the pad portions 332A and 332B exposed. The IC portion 62 is formed to support the drive IC 7. The resin layer 6 is made of a transparent epoxy resin.

The drive IC 7 is provided to selectively apply the electric current to the heating portions of the resistor layer 4 through the plurality of the individual electrodes 33. The drive IC 7 is mounted to the IC portion 62 of the resin layer 6. A plurality of pads 71 is formed on an upper surface of the drive IC 7 in a row. The pads 71 are connected to the bonding pads 333A and 333B by way of wires 81. As shown in FIG. 5, the drive IC 7 is also connected to wiring patterns formed in the wiring substrate 12. The wiring patterns serve to electrically interconnect the connector 83 and the drive IC 7. The extension portion of the common electrode 34 and the wiring patterns of the wiring substrate 12 are connected by the wires 81.

The encapsulation resin 82 is made of a black resin to protect the drive IC 7 and the wires 81. In the present embodiment, one end of the encapsulation resin 82 in the secondary scanning direction y overlaps with the electrode portion 61 of the resin layer 6. The pad portions 332A and 332B are covered with the encapsulation resin 82. The other end of the encapsulation resin 82 in the secondary scanning direction y leads to the wiring substrate 12.

Next, description will be made on the actions of the thermal print head A1 of the present embodiment.

In the thermal print head A1 described above, the pad portions 332A and 332B, in which the bonding pads 333A and 333B having an increased width are in an opposite positional relationship with the probe contact pads 334A and 334B having a reduced width, are arranged in an alternating manner. This makes it possible to increase the density of the pad portions 332A and 332B in the primary scanning direction x while keeping the dimension of the pad installation region 332 in the secondary scanning direction y within the length of each of the pad portions 332A and 332B. Since the probe contact pads 334A and 334B are the portions with which test probes make temporary contact, tests can be conducted with no difficulty even through the probe contact pads 334A and 334B have a reduced width in the primary scanning direction x. With the present embodiment, it is therefore possible to keep the pad installation region 332 narrow, thereby reducing the length of the wires 81 and hence the size of the ceramic substrate 11. These effects help reduce the size of the thermal print head A1.

With the present embodiment, the positions of the bonding pads 333A and 333B differ in the secondary scanning direction y. This makes it easy to bond the wires 81 to the bonding pads 333A and 333B.

By reducing the dimension of the pad installation region 332 in the secondary scanning direction y, it is possible to cut down the quantity of the encapsulation resin 82 needed to cover the pad installation region 332.

Figure 6:
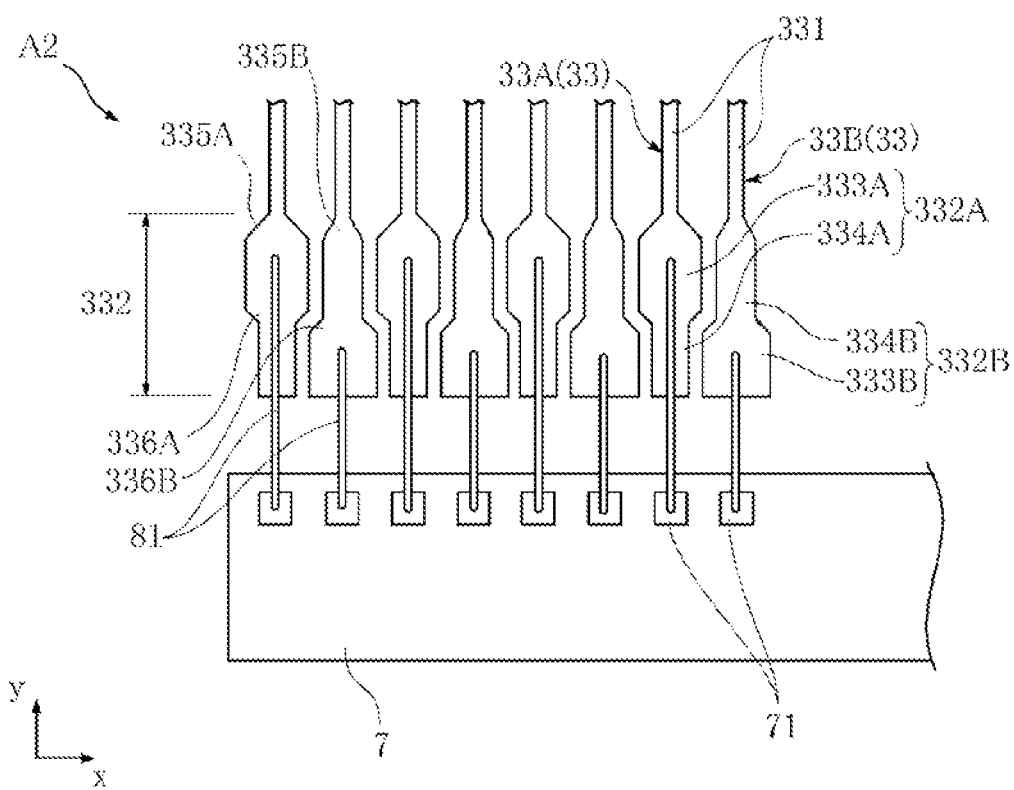
FIG. 6 is an enlarged view of major portions of a thermal print head according to a second embodiment of the present disclosure.

FIGS. 6 through 12 show other embodiments of the present disclosure. In these figures, the same or similar components as those of the foregoing embodiment are designated by the same reference symbols as used in the foregoing embodiment. FIG. 6 is an enlarged view of major portions of a thermal print head according to a second embodiment of the present disclosure. The thermal print head A2 shown in FIG. 6 differs from the afore-mentioned thermal print head A1 in terms of the configuration of the pad portions 332A and 332B. Other configurations remain the same as those of the afore-mentioned thermal print head A1. Description will now be given on the differing points of the thermal print head A2 from the thermal print head A1.

In the present embodiment, connecting portions 336A are provided between the bonding pads 333A and the probe contact pads 334A. Connecting portions 336B are provided between the bonding pads 333B and the probe contact pads 334B. The connecting portions 336A are formed such that the width thereof in the primary scanning direction x is gradually increased as the connecting portions 336A get closer to the bonding pads 333A in the secondary scanning direction y. The connecting portions 336B are formed such that the width thereof in the primary scanning direction x is gradually increased as the connecting portions 336B get closer to the bonding pads 333B in the secondary scanning direction y.

As stated above, the electrode layer 3 is formed by etching. If sharp-angled portions are generated in the pad portions 332A and 332B due to insufficient etching, the sharp-angled portions may possibly protrude outwards. There is also a possibility that sharp-angled portions are generated due to thermal deformation. These situations may sometimes result in the pad portions 332A and 332B making unsuitable contact with each other. With the configurations of the present embodiment, no sharp-angled portion is formed in the areas where the bonding pads 333A and 333B come closer to each other. It is therefore possible to prevent the problems mentioned above. The elimination of the mutual contact of the pad portions 332A and 332B makes it possible to arrange the pad portions 332A and 332B much closer.

Figure 7:
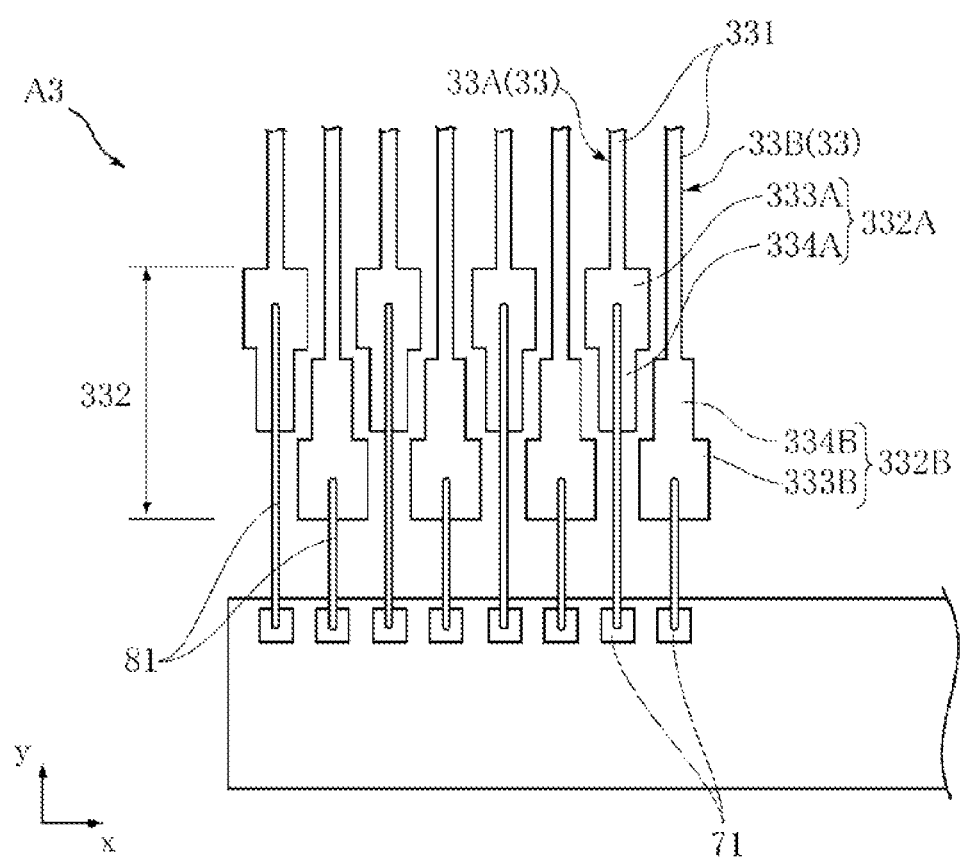
FIG. 7 is an enlarged view of major portions of a thermal print head according to a third embodiment of the present disclosure.

FIG. 7 is an enlarged view of major portions of a thermal print head according to a third embodiment of the present disclosure. The thermal print head A3 shown in FIG. 7 differs from the afore-mentioned thermal print head A1 in terms of the configuration and arrangement of the pad portions 332A and 332B. Other configurations remain the same as those of the afore-mentioned thermal print head A1. Description will now be given on the differing points of the thermal print head A3 from the thermal print head A1.

In the present embodiment, as shown in FIG. 7, the bonding pads 333A are arranged to lie between the strip-shaped portions 331. The probe contact pads 334A are arranged to lie between the probe contact pads 334B. In other words, the probe contact pads 334A and the probe contact pads 334B overlap with each other when seen in the primary scanning direction x. The pad-connecting portions 335A and 335B are not formed in the present embodiment.

With this configuration, it is possible to increase the installation density of the pad portions 332A and 332B in the primary scanning direction x while reducing the dimension of the pad installation region 332 in the secondary scanning direction y. The present embodiment is effective when one wishes to increase the installation density of the pad portions 332A and 332B in the primary scanning direction x.

Figure 8:
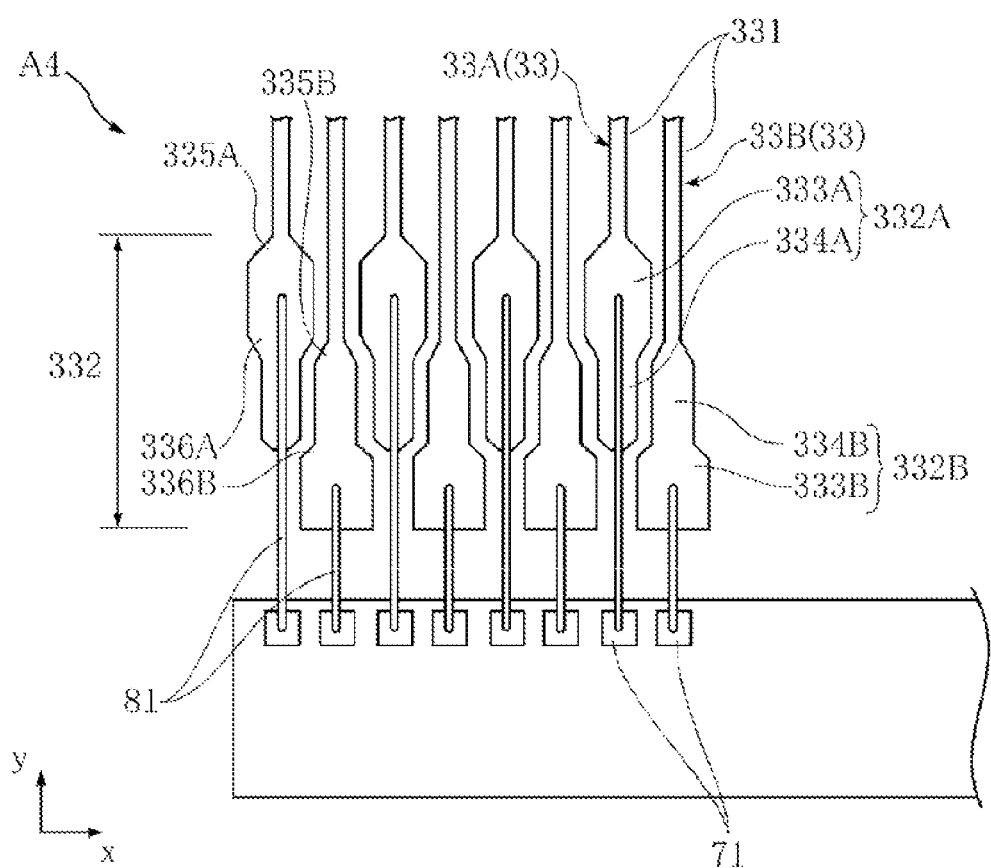
FIG. 8 is an enlarged view of major portions of a thermal print head according to a fourth embodiment of the present disclosure.

FIG. 8 is an enlarged view of major portions of a thermal print head according to a fourth embodiment of the present disclosure. The thermal print head A4 shown in FIG. 8 differs from the afore-mentioned thermal print head A3 in terms of the configuration of the pad portions 332A and 332B. Other configurations remain the same as those of the afore-mentioned thermal print head A3. Description will now be given on the differing points of the thermal print head A4 from the thermal print head A3.

In the present embodiment, connecting portions 336A are provided between the bonding pads 333A and the probe contact pads 334A. Connecting portions 336B are provided between the bonding pads 333B and the probe contact pads 334B. The connecting portions 336A are formed such that the width thereof in the primary scanning direction x is gradually increased as the connecting portions 336A get closer to the bonding pads 333A in the secondary scanning direction y. The connecting portions 336B are formed such that the width thereof in the primary scanning direction x is gradually increased as the connecting portions 336B get closer to the bonding pads 333B in the secondary scanning direction y.

In the present embodiment, pad-connecting portions 335A and 335B are further provided. The tip end sections of the probe contact pads 334A are formed into a pointed shape.

As stated above, the electrode layer 3 is formed by, e.g. etching. If sharp-angled portions are generated in the pad portions 332A and 332B due to insufficient etching, the sharp-angled portions may possibly protrude outwards. There is also a possibility that sharp-angled portions are generated due to thermal deformation. These situations may sometimes result in the pad portions 332A and 332B making unsuitable contact with each other. With the configurations of the present embodiment, no sharp-angled portion is formed in the areas where the bonding pads 333A and the probe contact pads 334B come closer to each other and in the areas where the bonding pads 333B and the probe contact pads 334A come closer to each other. It is therefore possible to prevent the problems mentioned above. The elimination of the mutual contact of the pad portions 332A and 332B makes it possible to arrange the pad portions 332A and 332B much closer.

Figure 9:
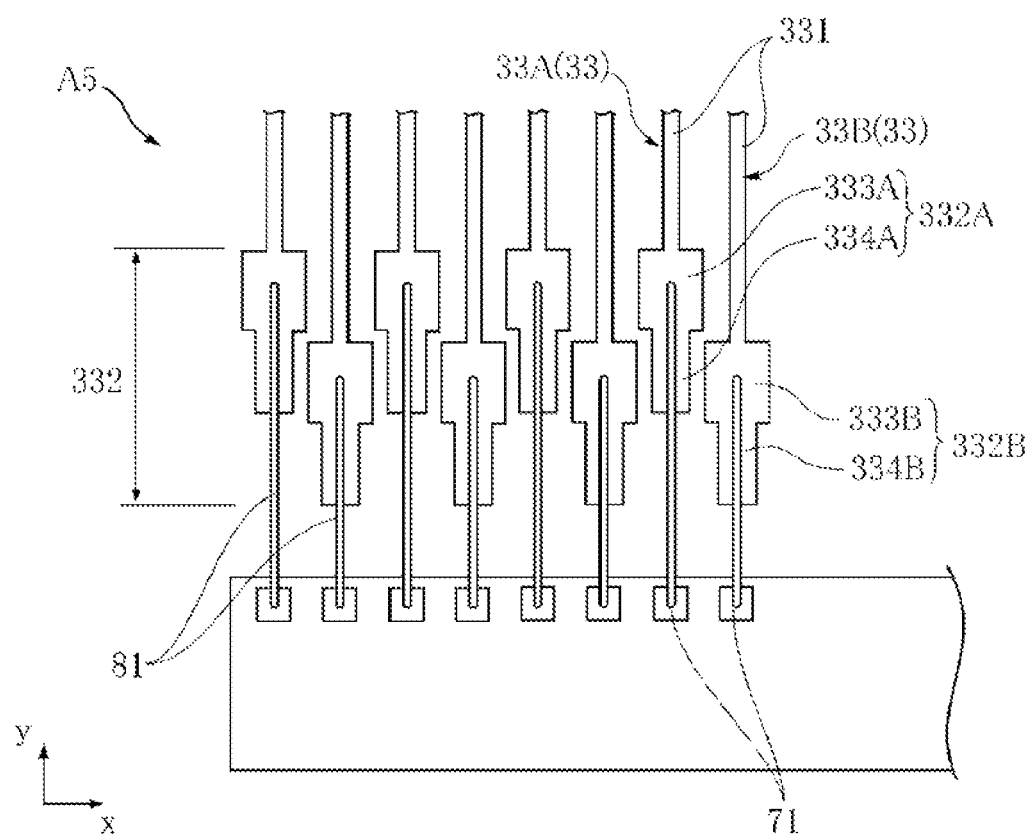
FIG. 9 is an enlarged view of major portions of a thermal print head according to a fifth embodiment of the present disclosure.

FIG. 9 is an enlarged view of major portions of a thermal print head according to a fifth embodiment of the present disclosure. The thermal print head A5 shown in FIG. 9 differs from the afore-mentioned thermal print head A1 in terms of the configuration and arrangement of the pad portions 332A and 332B. Other configurations remain the same as those of the afore-mentioned thermal print head A1. Description will now be given on the differing points of the thermal print head A5 from the thermal print head A1.

In the present embodiment, as shown in FIG. 9, the pad portions 332B are configured such that, as in the pad portions 332A, the bonding pads 333B are positioned closer to the strip-shaped portions 331 than the probe contact pads 334B. The bonding pads 333A are arranged to lie between the strip-shaped portions 331. The probe contact pads 334A are arranged to lie between the bonding pads 333B. In other words, the probe contact pads 334A and the bonding pads 333B partially overlap with each other when seen in the primary scanning direction x. In the present embodiment, the pad-connecting portions 335A and 335B are not provided.

With this configuration, it is possible to increase the installation density of the pad portions 332A and 332B in the primary scanning direction x while reducing the dimension of the pad installation region 332 in the secondary scanning direction y.

Figure 10:
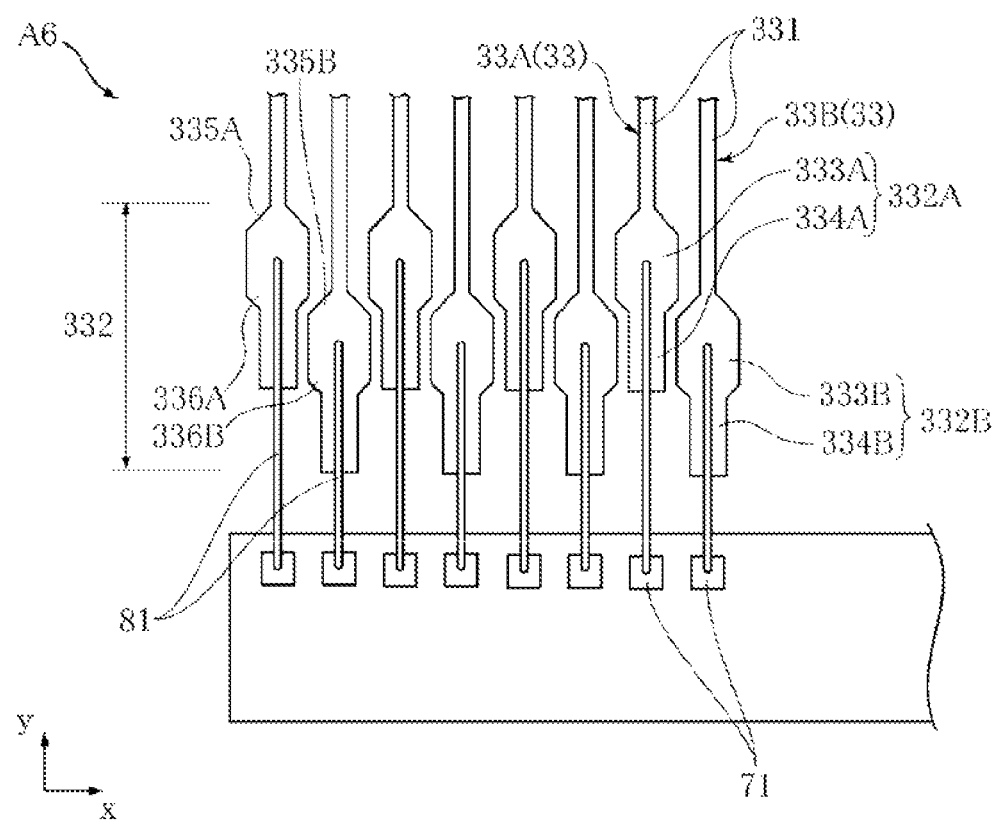
FIG. 10 is an enlarged view of major portions of a thermal print head according to a sixth embodiment of the present disclosure.

FIG. 10 is an enlarged view of major portions of a thermal print head according to a sixth embodiment of the present disclosure. The thermal print head A6 shown in FIG. 10 differs from the afore-mentioned thermal print head A5 in terms of the configuration of the pad portions 332A and 332B. Other configurations remain the same as those of the afore-mentioned thermal print head A5. Description will now be given on the differing points of the thermal print head A6 from the thermal print head A5.

In the present embodiment, connecting portions 336A are provided between the bonding pads 333A and the probe contact pads 334A. Connecting portions 336B are provided between the bonding pads 333B and the probe contact pads 334B. The connecting portions 336A are formed such that the width thereof in the primary scanning direction x is gradually increased as the connecting portions 336A get closer to the bonding pads 333A in the secondary scanning direction y. The connecting portions 336B are formed such that the width thereof in the primary scanning direction x is gradually increased as the connecting portions 336B get closer to the bonding pads 333B in the secondary scanning direction y. In the present embodiment, pad-connecting portions 335A and 335B are further provided.

As stated above, the electrode layer 3 is formed by etching. If sharp-angled portions are generated in the pad portions 332A and 332B due to insufficient etching, the sharp-angled portions may possibly protrude outwards. There is also a possibility that sharp-angled portions are generated due to thermal deformation. These situations may sometimes result in the pad portions 332A and 332B making unsuitable contact with each other. With the configurations of the present embodiment, no sharp-angled portion is formed in the areas where the bonding pads 333A and the probe contact pads 334B come closer to each other. It is therefore possible to prevent the problems mentioned above. The elimination of the mutual contact of the pad portions 332A and 332B makes it possible to arrange the pad portions 332A and 332B much closer.

Figure 11:
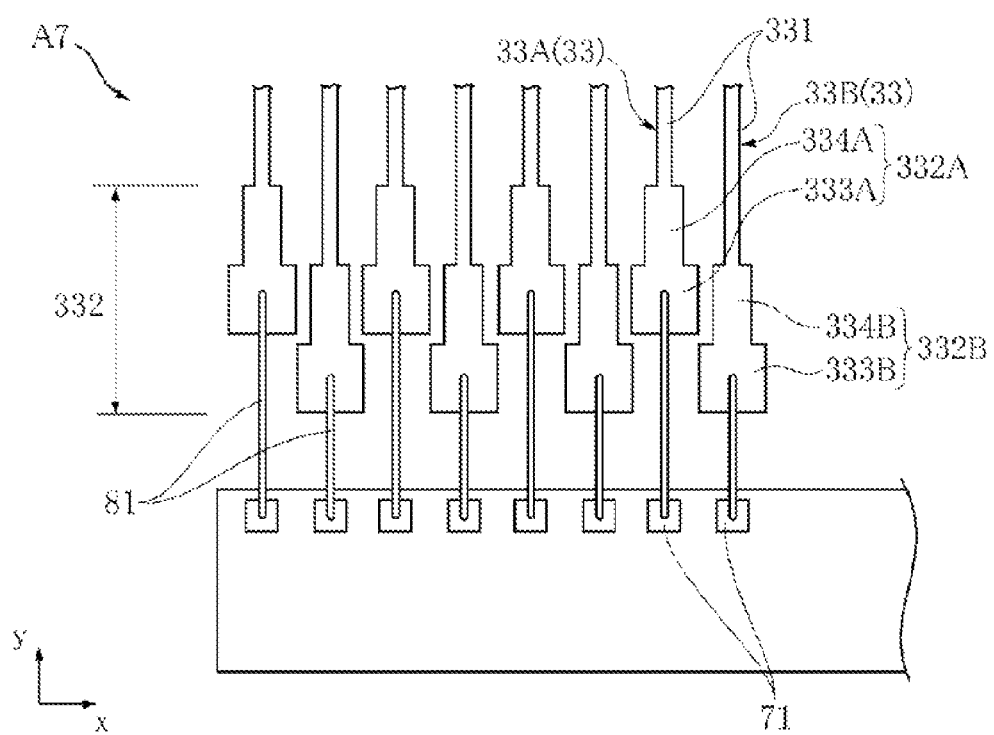
FIG. 11 is an enlarged view of major portions of a thermal print head according to a seventh embodiment of the present disclosure.

FIG. 11 is an enlarged view of major portions of a thermal print head according to a seventh embodiment of the present disclosure. The thermal print head A7 shown in FIG. 11 differs from the afore-mentioned thermal print head A1 in terms of the configuration and arrangement of the pad portions 332A and 332B. Other configurations remain the same as those of the afore-mentioned thermal print head A1. Description will now be given on the differing points of the thermal print head A7 from the thermal print head A1.

In the present embodiment, as shown in FIG. 11, the pad portions 332A are configured such that, as in the pad portions 332B, the probe contact pads 334A are positioned closer to the strip-shaped portions 331 than the bonding pads 333A. The bonding pads 333A are arranged to lie between the probe contact pads 334B. In other words, the bonding pads 333A and the probe contact pads 334B partially overlap with each other when seen in the primary scanning direction x. The pad-connecting portions 335A and 335B are not provided.

With this configuration, it is possible to increase the installation density of the pad portions 332A and 332B in the primary scanning direction x while reducing the dimension of the pad installation region 332 in the secondary scanning direction y.

Figure 12:
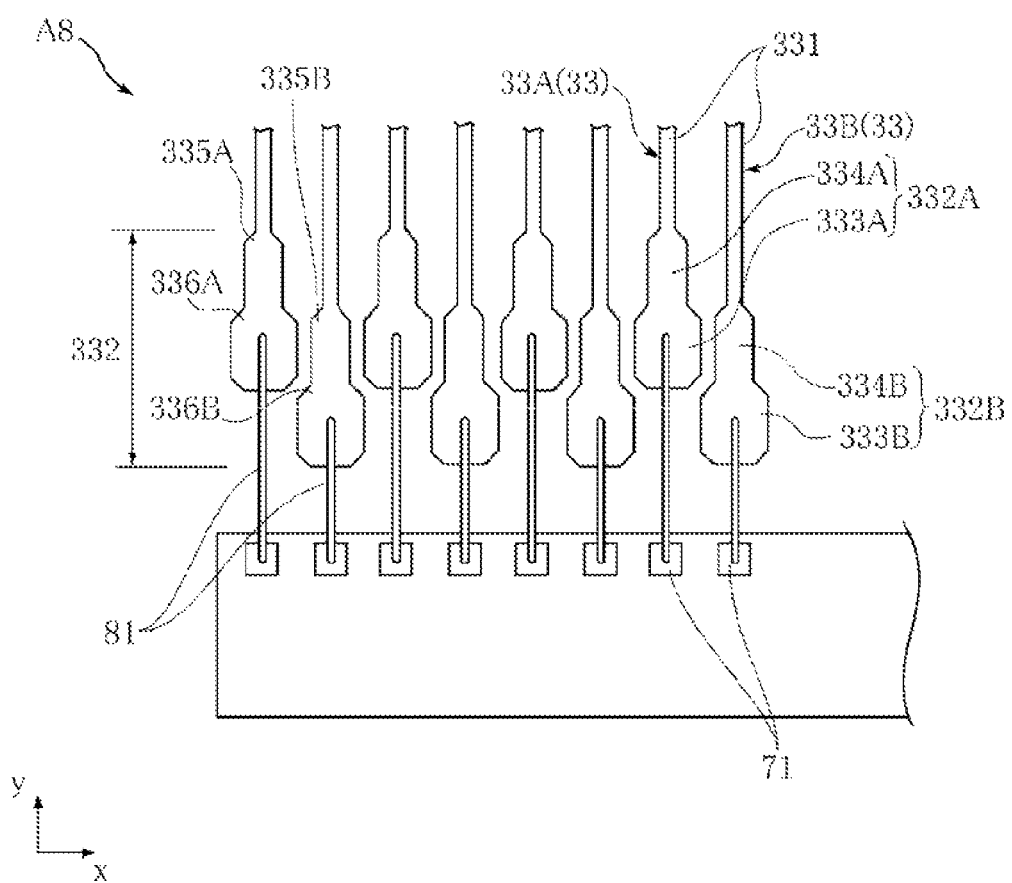
FIG. 12 is an enlarged view of major portions of a thermal print head according to a eighth embodiment of the present disclosure.

FIG. 12 is an enlarged view of major portions of a thermal print head according to an eighth embodiment of the present disclosure. The thermal print head A8 shown in FIG. 12 differs from the afore-mentioned thermal print head A7 in terms of the configuration of the pad portions 332A and 332B. Other configurations remain the same as those of the afore-mentioned thermal print head A7. Description will now be given on the differing points of the thermal print head A8 from the thermal print head A7.

In the present embodiment, connecting portions 336A are provided between the bonding pads 333A and the probe contact pads 334A. Connecting portions 336B are provided between the bonding pads 333B and the probe contact pads 334B. The connecting portions 336A are formed such that the width thereof in the primary scanning direction x is gradually increased as the connecting portions 336A get closer to the bonding pads 333A in the secondary scanning direction y. The connecting portions 336B are formed such that the width thereof in the primary scanning direction x is gradually increased as the connecting portions 336B get closer to the bonding pads 333B in the secondary scanning direction y. In the present embodiment, pad-connecting portions 335A and 335B are further provided. The tip end sections of the bonding pads 333A and 333B are formed to become narrow.

As stated above, the electrode layer 3 is formed by etching. If sharp-angled portions are generated in the pad portions 332A and 332B due to insufficient etching, the sharp-angled portions may possibly protrude outwards. There is also a possibility that sharp-angled portions are generated due to thermal deformation. These situations may sometimes result in the pad portions 332A and 332B making unsuitable contact with each other. With the configurations of the present embodiment, no sharp-angled portion is formed in the areas where the bonding pads 333A and the bonding pads 333B come closer to each other. It is therefore possible to prevent the problems mentioned above. The elimination of the mutual contact of the pad portions 332A and 332B makes it possible to arrange the pad portions 332A and 332B much closer.

Figure 13:
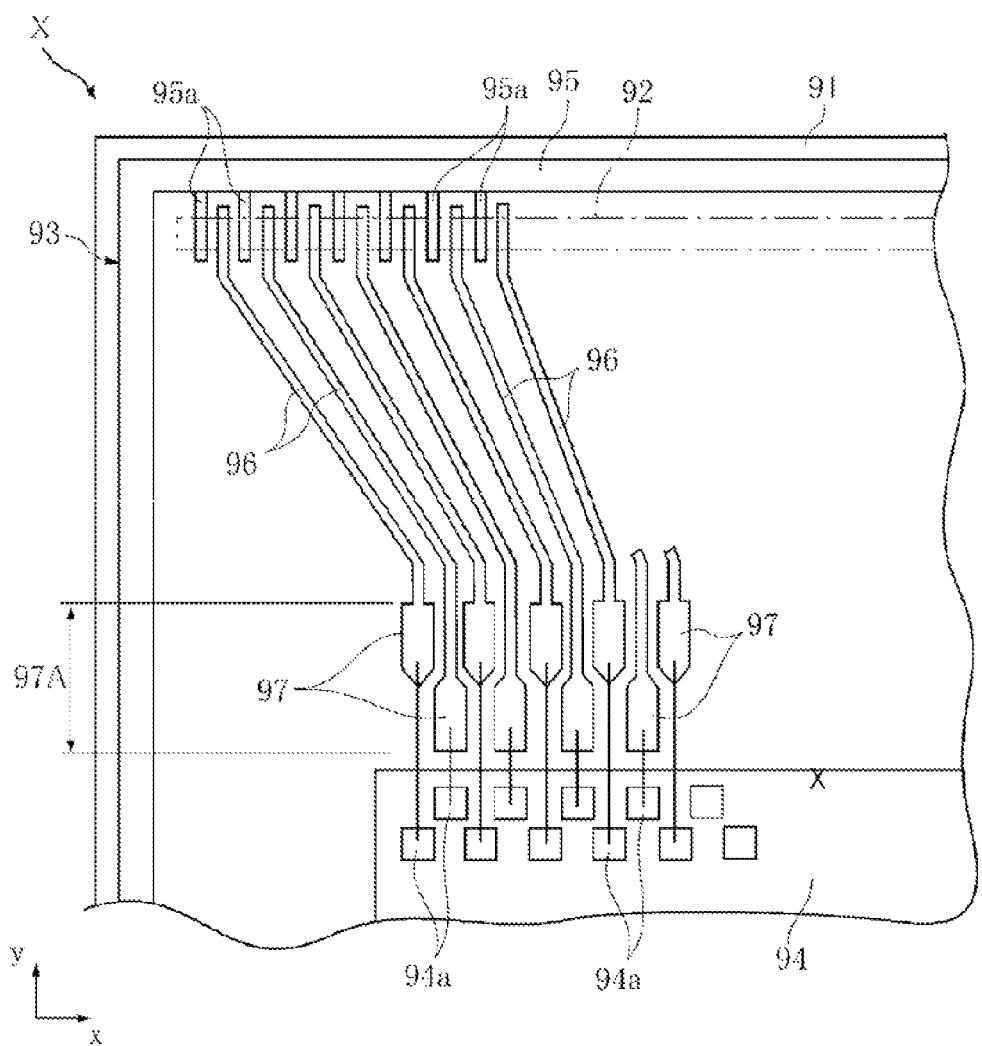
FIG. 13 is a plan configuration view illustrating one example of a conventional thermal print head.

The scope of the present disclosure is not limited to the embodiments described above. The specific configurations of the respective portions of the thermal print heads according to the present disclosure may be designed in many different ways. For example, while the pads 71 are arranged in a single row in the embodiments described above, they may be arranged in a staggered pattern as illustrated in FIG. 13.

While certain embodiments have been described, these embodiments have been presented by way of example only, and are not intended to limit the scope of the disclosures. Indeed, the novel thermal print heads described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A thermal print head, comprising:
a substrate;
a resistor layer supported on the substrate and provided with a plurality of heating portions arranged along a primary scanning direction;
an electrode layer provided with a plurality of individual electrodes arranged along the primary scanning direction;
a drive IC configured to selectively apply an electric current to the plurality of heating portions; and
a plurality of wires connected to the plurality of individual electrodes and the drive IC,
the plurality of individual electrodes including strip-shaped portions electrically connected to the plurality of heating portions and arranged along the primary scanning direction and pad portions greater in width in the primary scanning direction than the strip-shaped portions, the pad portions including bonding pads connected to each of the plurality of wires and probe contact pads, the probe contact pads being narrower in width in the primary scanning direction than the bonding pads, the plurality of individual electrodes including first individual electrodes provided with first pad portions and second individual electrodes adjoined to the first individual electrodes and provided with second pad portions, the first pad portions and the second pad portions at least partially overlapping with each other when viewed from the primary scanning direction.

2. The thermal print head of claim 1, wherein the first pad portions include first bonding pads, the second pad portions include second bonding pads, the first bonding pads and the second bonding pads not overlapping with each other when viewed from the primary scanning direction.

3. The thermal print head of claim 2, wherein the first individual electrodes include first strip-shaped portions connected to the first pad portions, the first pad portions including the first bonding pads and first probe contact pads spaced apart from the first strip-shaped portions farther than the first bonding pads in a secondary scanning direction, the second individual electrodes including second strip-shaped portions connected to the second pad portions, the second pad portions including the second bonding pads and second probe contact pads spaced apart from the second strip-shaped portions farther than the second bonding pads in the secondary scanning direction, the second bonding pads and the first probe contact pads at least partially overlapping with each other when viewed from the primary scanning direction.

4. The thermal print head of claim 2, wherein the first individual electrodes include first strip-shaped portions connected to the first pad portions, the first pad portions including the first bonding pads and first probe contact pads positioned closer to the first strip-shaped portions than the first bonding pads in a secondary scanning direction, the second individual electrodes including second strip-shaped portions connected to the second pad portions, the second pad portions including the second bonding pads and second probe contact pads positioned closer to the second strip-shaped portions than the second bonding pads in the secondary scanning direction, the first bonding pads and the second probe contact pads at least partially overlapping with each other when viewed from the primary scanning direction.

5. The thermal print head of claim 2, wherein the first individual electrodes include first strip-shaped portions connected to the first pad portions, the first pad portions including the first bonding pads and first probe contact pads spaced apart from the first strip-shaped portions farther than the first bonding pads in a secondary scanning direction, the second individual electrodes including second strip-shaped portions connected to the second pad portions, the second pad portions including the second bonding pads and second probe contact pads positioned closer to the second strip-shaped portions than the second bonding pads in the secondary scanning direction.

6. The thermal print head of claim 5, wherein the first bonding pads and the second probe contact pads at least partially overlap with each other when viewed from the primary scanning direction.

7. The thermal print head of claim 3, wherein the first bonding pads are smaller in length in the secondary scanning direction than the second probe contact pads.

8. The thermal print head of claim 5, wherein the first bonding pads and the second strip-shaped portions at least partially overlap with each other when viewed from the primary scanning direction, the first probe contact pads and the second probe contact pads at least partially overlapping with each other when viewed from the primary scanning direction.

9. The thermal print head of claim 1, wherein the pad portions include connecting portions provided between the bonding pads and the probe contact pads in a secondary scanning direction, the connecting portions formed such that the width thereof in the primary scanning direction is gradually increased as the connecting portions come closer to the bonding pads in the secondary scanning direction.

10. The thermal print head of claim 1, wherein pad-connecting portions are provided between the strip-shaped portions and the pad portions, the pad-connecting portions formed such that the width thereof in the primary scanning direction is gradually increased as the connecting portions come closer to the pad portions in a secondary scanning direction.

11. The thermal print head of claim 1, wherein probe marks are formed in the probe contact pads.

12. The thermal print head of claim 1, wherein the electrode layer includes a normal thickness portion and an increased thickness portion thicker than the normal thickness portion, the increased thickness portion including the bonding pads.

13. The thermal print head of claim 12, wherein the electrode layer includes a main Au layer making up the normal thickness portion and an auxiliary Au layer formed on the main Au layer, the main Au layer and the auxiliary Au layer making up the increased thickness portion.

14. The thermal print head of claim 13, wherein the auxiliary Au layer is made of a material containing Au mixed with glass.

15. The thermal print head of claim 13, wherein the auxiliary Au layer is higher in Au percentage than the main Au layer.

16. The thermal print head of claim 13, wherein the main Au layer and the auxiliary Au layer are formed by printing Au-containing paste and then sintering the paste.

17. The thermal print head of claim 13, wherein the auxiliary Au layer is formed to expose the probe contact pads.

18. The thermal print head of claim 1, wherein the resistor layer contains $TaSiO_2$ or TaN.

19. The thermal print head of claim 18, wherein the resistor layer is formed by printing paste containing $TaSiO_2$ or TaN and then sintering the paste.

20. The thermal print head of claim 1, further comprising:
a glaze layer including a heating resistor support portion extending in the primary scanning direction and having an arc-like cross-sectional shape on a plane perpendicular to the primary scanning direction and an IC electrode support portion spaced apart from the heating resistor support portion in a secondary scanning direction, the IC electrode support portion positioned between the plurality of the pad portions and the substrate.

* * * * *